(12) United States Patent
Koller et al.

(10) Patent No.: US 11,106,144 B2
(45) Date of Patent: Aug. 31, 2021

(54) LITHOGRAPHIC METHOD AND APPARATUS

(71) Applicant: ASML Netherlands B.V., Veldhoven (NL)

(72) Inventors: Paulus Hubertus Petrus Koller, Roermond (NL); Johannes Jacobus Matheus Baselmans, Oirschot (NL); Bartolomeus Petrus Rijpers, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/629,480

(22) PCT Filed: Jun. 12, 2018

(86) PCT No.: PCT/EP2018/065508
§ 371 (c)(1),
(2) Date: Jan. 8, 2020

(87) PCT Pub. No.: WO2019/011552
PCT Pub. Date: Jan. 17, 2019

(65) Prior Publication Data
US 2021/0132507 A1 May 6, 2021

(30) Foreign Application Priority Data
Jul. 10, 2017 (EP) .................................... 17180465

(51) Int. Cl.
*G03F 7/20* (2006.01)
(52) U.S. Cl.
CPC ........ *G03F 7/7085* (2013.01); *G03F 7/70133* (2013.01); *G03F 7/70341* (2013.01)

(58) Field of Classification Search
CPC ............... G03F 7/7085; G03F 7/70733; G03F 7/70341; G03F 7/70725; G03F 7/70775
(Continued)

(56) References Cited

U.S. PATENT DOCUMENTS

| 6,333,777 | B1 | 12/2001 | Sato |
| 7,282,701 | B2 | 10/2007 | Kok et al. |

(Continued)

FOREIGN PATENT DOCUMENTS

| JP | 2005-268744 A | 9/2005 |
| JP | 2006-032834 A | 2/2006 |

(Continued)

OTHER PUBLICATIONS

International Search Report and Written Opinion of the International Searching Authority directed to related International Patent Application No. PCT/EP2018/065508, dated Oct. 12, 2018; 9 pages.

(Continued)

*Primary Examiner* — Hung Nguyen
(74) *Attorney, Agent, or Firm* — Sterne, Kessler, Goldstein & Fox P.L.L.C.

(57) ABSTRACT

Method of determining a photodetector contribution to a measurement of apodization of a projection system of an immersion lithography apparatus, the method comprising providing a beam of radiation, illuminating an object with the beam of radiation, using the projection system to project an image of the object through a liquid layer and onto a photodetector, performing a first set of measurements of radiation intensity across a pupil plane of the projection system at a first liquid layer thickness, performing a second set of measurements of radiation intensity across the pupil plane of the projection system at a different liquid layer thickness, determining a set of intensity differences from the (Continued)

first set of measurements and the second set of measurements, comparing the determined set of intensity differences to an expected set of intensity difference, and using the results of the comparison to determine the photodetector contribution to a measurement of apodization.

19 Claims, 6 Drawing Sheets

(58) Field of Classification Search
USPC .................................................. 355/30, 53
See application file for complete search history.

(56) References Cited

U.S. PATENT DOCUMENTS

| | | | |
|---|---|---|---|
| 9,261,402 | B2 | 2/2016 | Baselmans |
| 9,330,912 | B2 | 5/2016 | Mulkens et al. |
| 10,025,194 | B2 | 7/2018 | Nishinaga et al. |
| 2002/0085286 | A1 | 7/2002 | Drodofsky et al. |
| 2006/0019204 | A1 | 1/2006 | Endo et al. |
| 2006/0050260 | A1 | 3/2006 | Van De Kerkhof et al. |
| 2006/0055906 | A1 | 3/2006 | Van De Kerkhof et al. |
| 2006/0091324 | A1* | 5/2006 | Marie Dierichs ...... G02B 27/58 |
| | | | 250/492.2 |
| 2006/0170891 | A1 | 8/2006 | Nishinaga et al. |
| 2006/0192937 | A1 | 8/2006 | Kerkhof et al. |
| 2006/0203221 | A1 | 9/2006 | Van De Kerkhof et al. |
| 2007/0070329 | A1 | 3/2007 | Matheus Baselmans et al. |
| 2009/0059189 | A1 | 3/2009 | Goehnermeier et al. |
| 2010/0149507 | A1 | 6/2010 | Van De Kerkhof et al. |
| 2013/0217636 | A1 | 8/2013 | Farias-Eisner et al. |
| 2013/0271636 | A1* | 10/2013 | Baselmans ................ G01J 1/42 |
| | | | 348/333.08 |
| 2015/0009492 | A1 | 1/2015 | Frese et al. |
| 2016/0202118 | A1* | 7/2016 | Ehrmann .................. G01J 3/18 |
| | | | 250/252.1 |

FOREIGN PATENT DOCUMENTS

| | | |
|---|---|---|
| JP | 2008-131045 A | 6/2008 |
| JP | 2011-129653 A | 6/2011 |
| JP | 2013-225673 A | 10/2013 |
| JP | 2016-538576 A | 12/2016 |
| KR | 2006-0083214 A | 7/2006 |

OTHER PUBLICATIONS

International Preliminary Report on Patentability directed to related International Patent Application No. PCT/EP2018/065508, dated Jan. 14, 2020; 7 pages.

* cited by examiner

LITHOGRAPHIC METHOD AND APPARATUS

CROSS REFERENCE TO RELATED APPLICATIONS

This application claims priority of EP application 17180465.1 which was filed on 10 Jul. 2017 and which is incorporated herein in its entirety by reference.

FIELD

The present invention relates to a lithographic method and apparatus.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

An immersion lithographic apparatus comprises an illumination system, a projection system and a liquid layer. Both the illumination system and the projection system have inherent apodization properties. Apodization describes the angular transmission of radiation through an optical system, such as the illumination system and the projection system. It is desirable to determine the apodization properties of the projection system such that lithographic errors resulting from the apodization properties of the projection system may be accounted for. A photodetector may be used to measure an angular intensity distribution of radiation passing through the lithographic apparatus. However, the photodetector output contains illumination system apodization contributions, projection system apodization contributions and contributions from the photodetector itself. U.S. Pat. No. 9,261,402, which is hereby incorporated by reference, describes a technique of removing the illumination system apodization contributions from the measurement. It is desirable to provide, for example, a method of determining a photodetector contribution to a measurement of apodization of a projection system of an immersion lithography apparatus that obviates or mitigates one or more of the problems of the prior art, whether identified herein or elsewhere.

SUMMARY

According to an aspect of the invention, there is provided a method of determining a photodetector contribution to a measurement of apodization of a projection system of an immersion lithography apparatus, the method comprising providing a beam of radiation, illuminating an object with the beam of radiation, using the projection system to project an image of the object through a liquid layer and onto a photodetector, performing a first set of measurements of radiation intensity across a pupil plane of the projection system at a first liquid layer thickness, performing a second set of measurements of radiation intensity across the pupil plane of the projection system at a different liquid layer thickness, determining a set of intensity differences from the first set of measurements and the second set of measurements, comparing the determined set of intensity differences to an expected set of intensity differences, and using the results of the comparison to determine the photodetector contribution to a measurement of apodization.

Apodization may negatively affect an imaging performance of the projection system and thereby negatively affect the performance of the lithographic apparatus. Apodization properties of the lithographic apparatus may be determined using a photodetector within the lithographic apparatus. Measurements made using the photodetector may include angle-dependent properties of the photodetector itself which negatively affect the accuracy of the apodization measurements. Performing apodization measurements at two different liquid layer thicknesses enables a known change in apodization to be applied to the projection system. Comparing the results with expected results advantageously enables the photodetector contribution to be determined in a simple way without requiring re-design of known immersion lithographic apparatus. Once determined, the photodetector contribution to apodization measurements may be removed from future apodization measurements of the projection system, thus enabling more accurate determination of the apodization properties of the projection system. The determined apodization properties of the projection system may then be accounted for when performing lithographic exposures, thus enabling more accurate lithographic exposures to be achieved.

The comparison may comprise determining a difference between the determined set of intensity differences and a mathematical function that is used to calculate the expected set of intensity differences.

Determining the difference between the determined set of intensity differences and the mathematical function may comprise using curve fitting and wherein the mathematical function comprises an exponential term.

The exponential term may be $$e^{-\frac{\alpha d}{\cos\theta}}$$

where $\alpha$ is an absorption coefficient of the liquid layer, $d$ is the thickness of the liquid layer and $\theta$ is an angle of incidence of the beam of radiation corresponding to a position in the pupil plane of the projection system.

The difference between the first liquid layer thickness and the second liquid layer thickness may be greater than 100 micrometers.

The difference between the first liquid layer thickness and the second liquid layer thickness may be up to 1000 micrometers.

The method may further comprise changing an illumination setting of the lithographic apparatus and repeating the first set of measurements and the second set of measurements.

A substrate table may comprise the photodetector and the difference in liquid layer thickness between the first set of measurements and the second set of measurements may be achieved by movement of the substrate table.

The method may further comprise providing the object at a first distance from the projection system during the first set of measurements and providing the object at a different distance from the projection system during the second set of measurements.

The method may further comprise providing the object on a surface of a reticle and inverting the reticle after the first set of measurements such that a distance between the object and the projection system is changed before the second set of measurements.

The method may further comprise providing opposing surfaces of the reticle with absorbing layers.

The object may be a mark provided in one of the absorbing layers.

The method may further comprise providing an aperture that is larger than the mark in the absorbing layer directly opposite the mark.

A second substantially identical mark may be formed in the other absorbing layer such that the second mark does not align with the first mark and wherein the first mark is illuminated during the first set of measurements and the reticle is moved after the first set of measurements such that the second mark is illuminated during the second set of measurements.

The mark may be a pinhole.

The mark may be a grating.

Sets of measurements of radiation intensity across a pupil plane of the projection system may be performed at more than two liquid layer thicknesses.

The results of the measurements may be used to improve an accuracy of the mathematical function that is used to calculate the expected set of intensity differences.

According to a second aspect of the invention, there is provided a method of determining a photodetector contribution to a measurement of apodization of a projection system of an immersion lithography apparatus, the method comprising providing a beam of radiation, illuminating an object with the beam of radiation, using the projection system to project an image of the object through a liquid layer and onto a photodetector, performing a first set of measurements of radiation intensity across a pupil plane of the projection system using a first liquid, replacing the first liquid with a second liquid having a different absorption coefficient, performing a second set of measurements of radiation intensity across the pupil plane of the projection system using the second liquid, determining a set of intensity differences from the first set of measurements and the second set of measurements, comparing the determined set of intensity differences to an expected set of intensity differences, and using the results of the comparison to determine the photodetector contribution to a measurement of apodization.

Performing apodization measurements using two different liquid layers having different absorption coefficients enables a known change in apodization to be applied to the projection system. Comparing the results with expected results advantageously enables the photodetector contribution to be determined in a simple way without requiring re-design of known immersion lithographic apparatus. Using two different liquid layers having different absorption coefficients advantageously enables a known apodization to be applied to the projection system without requiring movement of parts of the lithographic apparatus (e.g. a substrate table). Once determined, the photodetector contribution to apodization measurements may be removed from future apodization measurements of the projection system, thus enabling more accurate determination of the apodization properties of the projection system. The determined apodization properties of the projection system may then be accounted for when performing lithographic exposures, thus enabling more accurate lithographic exposures to be achieved.

The first liquid and the second liquid may have substantially the same refractive index.

According to a third aspect of the invention, there is provided an immersion lithography apparatus comprising an illumination system for providing a beam of radiation, a support structure for supporting a reticle comprising an object, a substrate table for holding a substrate, the substrate table comprising a photodetector, a projection system for projecting the radiation beam onto the photodetector, an immersion hood for providing a liquid layer between the projection system and the photodetector, and a positioning device configured to move the substrate table so as to enable adjustment of a thickness of the liquid layer, and a processor configured to receive a first set of measurements from the photodetector at a first liquid layer thickness, receive a second set of measurements from the photodetector at a different liquid layer thickness, determine a set of intensity differences from the first set of measurements and the second set of measurements, compare the determined set of intensity differences to an expected set of intensity differences and use the results of the comparison to determine a photodetector contribution to the measurements.

Performing apodization measurements at two different liquid layer thicknesses enables a known change in apodization to be applied to the projection system. Comparing the results with expected results advantageously enables the photodetector contribution to be determined in a simple way without requiring re-design of known immersion lithographic apparatus. Once determined, the photodetector contribution to apodization measurements may be removed from future apodization measurements of the projection system, thus enabling more accurate determination of the apodization properties of the projection system. The determined apodization properties of the projection system may then be accounted for when performing lithographic exposures, thus enabling more accurate lithographic exposures to be achieved.

The difference between the first liquid layer thickness and the second liquid layer thickness may be between about 100 micrometers and about 1000 micrometers.

The object may be at a first distance from the projection system during the first set of measurements and the object may be at a different distance from the projection system during the second set of measurements.

The apparatus may further comprise providing opposing surfaces of the reticle with absorbing layers.

The object may be a mark provided in one of the absorbing layers.

The reticle may comprise an aperture that is larger than the mark in the absorbing layer directly opposite the mark.

According to a fourth aspect of the invention, there is provided a computer program comprising computer readable instructions configured to cause a computer to carry out a method according to the first aspect of the invention or any of its associated options.

According to a fifth aspect of the invention, there is provided a computer readable medium carrying a computer program according to the fourth aspect of the invention.

According to a sixth aspect of the invention, there is provided a computer apparatus for determining a photodetector contribution to a measurement of apodization of a projection system of an immersion lithography apparatus, the computer apparatus comprising a memory storing processor readable instructions, and a processor arranged to read and execute instructions stored in said memory, wherein said processor readable instructions comprise instructions arranged to control the computer to carry out a method according to the first aspect of the invention or any of its associated options.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable minor arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus is of a type wherein the substrate is immersed in a liquid having a relatively high refractive index, e.g. water, so as to fill a space between the final element of the projection system and the substrate Immersion techniques are well known in the art for increasing the numerical aperture of projection systems.

Figure 1:
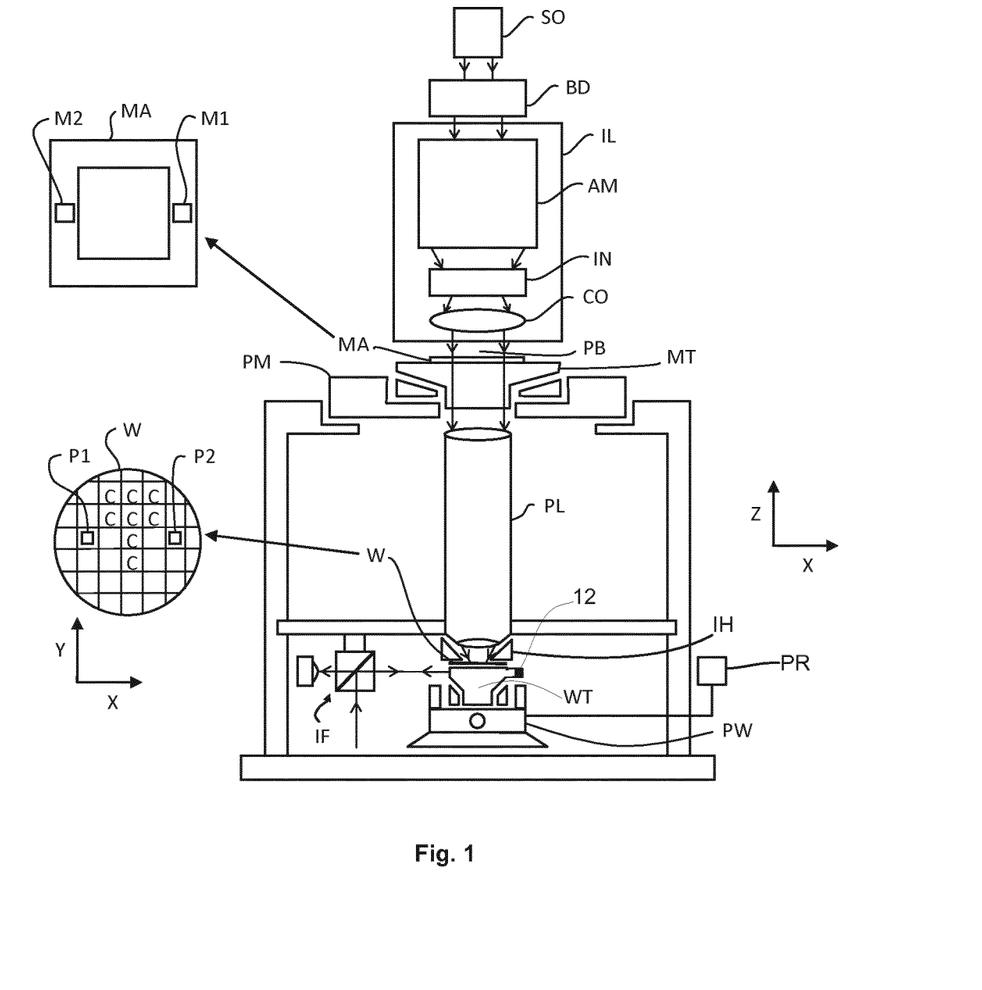
FIG. 1 depicts an immersion lithographic apparatus comprising a photodetector and a processor which may be used to measure apodization in an embodiment of the invention.

FIG. 1 schematically depicts an immersion lithographic apparatus comprising a photodetector and a processor which may be used to measure apodization in an embodiment of the invention. The apparatus comprises:

an illumination system (illuminator) IL to condition a beam PB of radiation (e.g. UV radiation).
a support structure (e.g. a support structure) MT to support a patterning device (e.g. a mask) MA and connected to first positioning device PM to accurately position the patterning device with respect to item PL;
a substrate table (e.g. a wafer table) WT for holding a substrate (e.g. a resist coated wafer) W and connected to second positioning device PW for accurately positioning the substrate with respect to item PL; and a projection system (e.g. a refractive projection lens) PL configured to image a pattern imparted to the radiation beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a reflective mask or programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation PB, having a desired uniformity and intensity distribution in its cross section.

The radiation beam PB is incident on the patterning device (e.g. mask) MA, which is held on the support structure MT. Having traversed the patterning device MA, the beam PB passes through the projection system PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus comprises an immersion hood IH. The immersion hood IH comprises a layer of liquid (not shown). The liquid layer has a refractive index greater than one. The term "refractive index" as used herein is intended to indicate the real part of refractive index that is associated with refraction. The liquid layer may, for example, comprise water. The liquid layer fills a gap between the projection system PS and the substrate W. That is, radiation exiting the projection system travels through the liquid layer before being incident on a substrate on the substrate table. The liquid layer acts to increase a numerical aperture of the projection system PS.

Apodization may be defined as the angular dependency of transmission of an optical system. Apodization may negatively affect an imaging performance of the projection system PS and thereby negatively affect the performance of the lithographic apparatus. Apodization may contribute to lithographic errors which may limit an imaging performance of the lithographic apparatus. For example, a variation of the critical dimension of the lithographic apparatus may be negatively affected by effects that are attributable to apodization.

Apodization properties of the projection system PS may be determined when the optical components of the projection system PS are first manufactured. However, apodization properties of the projection system PS may change over time. For example, contaminant particles present in the projection system PS may absorb some radiation passing through the projection system PS. This may modify intensity of radiation incident on a substrate with respect to the angle of incidence of that radiation, thereby changing the apodization properties of the projection system PS. It is desirable to have a method of determining the apodization properties of the projection system PS of the lithographic apparatus. Once determined, the apodization properties of the projection system PS may be partly or fully compensated for when using the lithographic apparatus to perform a lithographic exposure.

Apodization properties of the lithographic apparatus may be determined using a photodetector 12 within the lithographic apparatus. The photodetector 12 may be located at an image plane of the projection system PS, e.g. proximate the substrate W. The photodetector 12 may, for example, be located in or on the substrate table WT. The photodetector 12 may be configured to measure an intensity of radiation across a pupil plane of the projection system PS. For example, the photodetector 12 may comprise an integrated lens interferometer at scanner (ILIAS) sensor. An ILIAS sensor is an interferometric wavefront measurement system that may perform static measurements on lens aberrations up to high order. An ILIAS sensor may be implemented as an integrated measurement system used for system initialization and calibration. Alternatively, an ILIAS sensor may be used for monitoring and recalibration "on-demand". U.S. Pat. No. 7,282,701B2, which is hereby incorporated by reference, discloses an ILIAS sensor that may be used to determine an intensity profile of radiation across a pupil plane of the projection system PS. The intensity profile of radiation across a pupil plane of the projection system PS may be thought of as an image of the angular distribution of radiation that is transmitted by the projection system PS. A point in the pupil plane of the projection system PS may correspond with an angle of incidence in a field plane of the projection system, and vice versa.

Measurements made using the photodetector 12 may contain contributions from the apodization properties of the projection system PS, the apodization properties of the illumination system IL and the angle-dependent properties of the photodetector 12 itself. The angle-dependent properties of the photodetector may, for example, include ghosting effects arising from unwanted internal reflections occurring within the photodetector, electronic crosstalk within the photodetector, etc. As discussed above, U.S. Pat. No. 9,261, 402 discloses a technique of removing the contribution of the illumination system IL from the apodization measurement made by the photodetector 12. However, the contribution from the angle-dependent properties of the photodetector 12 is still present in the measurement made by the photodetector. If the angle-dependent properties of the photodetector 12 are known then they can be removed from the measurement. However, the angle-dependent properties of the photodetector 12 are often not known and may change over the lifetime of the photodetector.

The liquid layer in an immersion lithographic apparatus may be thought of as the final optical component of the projection system PS. A known change in apodization may be applied to the projection system PS by changing the thickness of the liquid layer. That is, a first set of measurements of radiation intensity across a pupil plane of the projection system PS may be performed at a first liquid layer thickness. A second set of measurements of radiation intensity across a pupil plane of the projection system PS may be performed at a different liquid layer thickness. A set of intensity differences between the first set of measurements and the second set of measurements may be determined. The known change in apodization may be used to calculate an expected set of intensity differences. The determined set of intensity differences may be compared to the expected set of intensity differences. The results of the comparison may be used to determine the photodetector contribution to apodization measurements. Once determined, the photodetector contribution to apodization measurements may be removed from future apodization measurements of the projection system, thus enabling more accurate determination of the apodization properties of the projection system PS.

The change in thickness of the liquid layer may be achieved using a positioning device PW of the lithographic apparatus.

The lithographic apparatus may comprise a processor PR that is configured to receive a first set of measurements from the photodetector 12 at a first liquid layer thickness and receive a second set of measurements from the photodetector 12 at a different liquid layer thickness. The processor PR may then determine a set of intensity differences from the first set of measurements and the second set of measurements and compare the determined set of intensity differences to an expected set of intensity differences. The processor PR may be configured to use the results of the comparison to determine the photodetector 12 contribution to the apodization measurements.

Figure 2A:
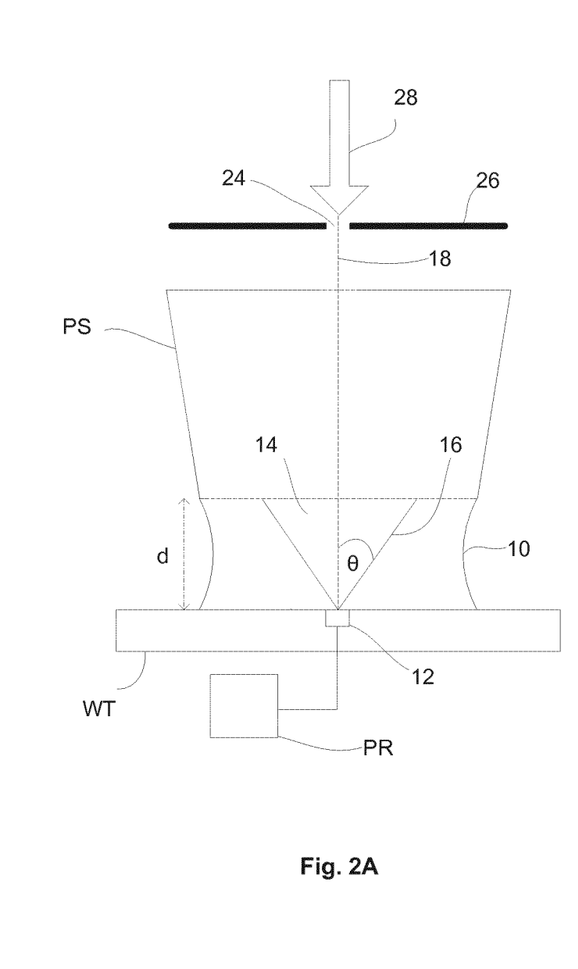
FIGS. 2A-2B schematically depict part of an immersion lithographic apparatus having an adjustable liquid layer thickness according to an embodiment of the invention.
Figure 2B:
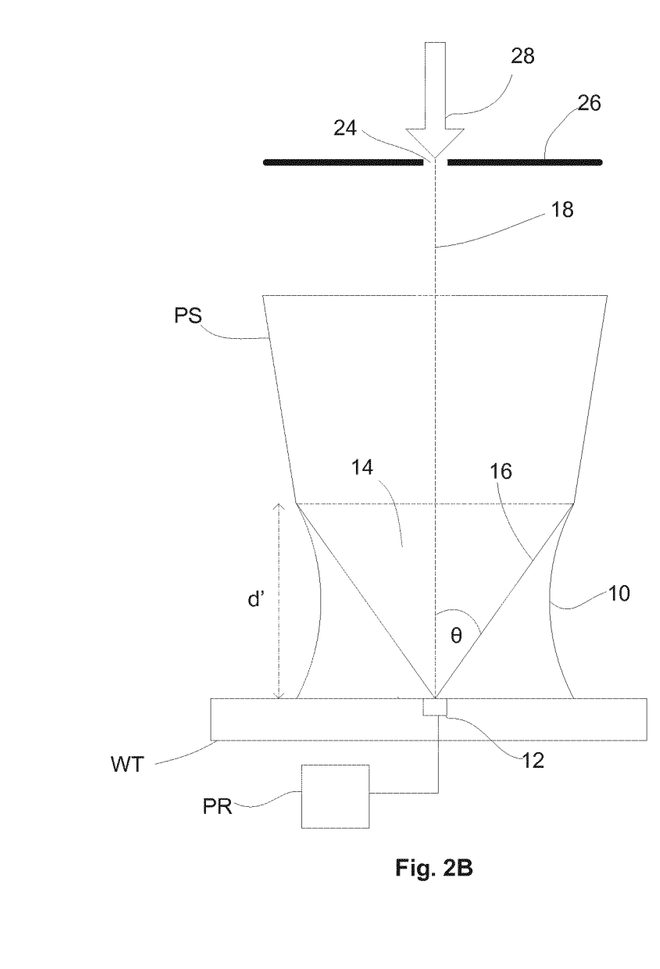

FIG. 2, consisting of FIG. 2A and FIG. 2B, schematically depicts part of an immersion lithographic apparatus having an adjustable liquid layer thickness according to an embodiment of the invention. FIG. 2A schematically depicts a projection system PS and a substrate table WT of an immersion lithographic apparatus. A layer of liquid 10 exists between the projection system PS and the substrate table WT. The layer of liquid 10 may, for example, comprise water. A beam of radiation 28 is used to illuminate an object 24. The object 24 may be a mark on a patterning device such as, for example, a pinhole in a reticle 26. An image of the object 24 is then projected through the layer of liquid 10 and onto a photodetector 12 using the projection system PS. The substrate table WT may comprise the photodetector 12.

The photodetector 12 may be configured to measure an intensity of radiation across a pupil plane of the projection system PS. For example, the photodetector 12 may be an ILIAS sensor. A cone of radiation 14 exits the projection system PS, travels through the layer of liquid 10 and is incident on the photodetector 12. The photodetector 12 may be configured to detect the radiation 14 and output a signal indicative of the intensity of radiation across a pupil plane of the projection system PS to a processor PR. The processor PR may be configured to store in memory a first set of measurements performed at a first liquid layer thickness d. The first liquid layer thickness d may, for example, be about 3 mm.

The layer of liquid 10 is not completely transparent and absorbs some of the radiation 14 passing through the layer of liquid 10. The greater the optical path length of radiation passing through the layer of liquid 10, the greater the amount of radiation 14 that is absorbed by the layer of liquid 10. Changing the thickness d of the layer of liquid 10 changes an optical path length through which the rays of radiation 14 must travel to reach the photodetector 12. The change in the optical path length through which rays of radiation 14 must travel to reach the photodetector 12 depends at least in part upon an angle of incidence of the radiation. Having knowledge of the thickness d of the layer of liquid 10, the absorption properties of the layer of liquid 10 and the maximum half-angle θ of the cone of radiation 14 exiting the projection system PS, a known change in apodization may be applied to the projection system PS by changing a thickness of the layer of liquid 10.

FIG. 2B schematically depicts the lithographic components shown in FIG. 2A with an increased thickness d' of the layer of liquid 10. A positioning device (e.g. the second positioning device PW depicted in FIG. 1) may be used to move the substrate table WT, and thus the photodetector 12, along the optical axis 18 of the lithographic apparatus. Moving the substrate table WT such that there is a greater distance between the projection system PS and the photodetector 12 increases a thickness d' of the layer of liquid 10, which increases the fraction of radiation 14 absorbed by the layer of liquid 10. Moving the substrate table WT such that there is a smaller distance between the projection system PS and the photodetector 12 decreases a thickness of the layer of liquid 10, which decreases the fraction of radiation 14 absorbed by the layer of liquid 10. In the example of FIG. 2B the substrate table WT has been moved such that a distance between the projection system PS and the photodetector 12 has increased when compared to the lithographic components shown in FIG. 2A. The extent to which the thickness d' of the layer of liquid 10 may be increased may be limited by a design of the immersion hood, e.g. the maximum amount of liquid 14 that the immersion hood is capable of providing between the projection system PS and the photodetector 12. Increasing the distance between the projection system PS and the photodetector 12 by too much may cause the layer of liquid 10 to at least partially separate from the projection system PS, which may result in some radiation 14 passing through the surroundings (e.g. air) rather than through the layer of liquid 10. The extent to which the thickness of a liquid layer of water may be increased in an immersion lithography apparatus may, for example, be greater than 100 µm. The extent to which the thickness of a liquid layer of water may be decreased in an immersion lithography apparatus may, for example, be up to 1000 µm. The extent to which the thickness of a liquid layer of water may be decreased in an immersion lithography apparatus may be greater than 1000 µm. The smallest change in the thickness of the layer of liquid required to induce a detectable change in the apodization of the projection system may depend at least in part upon a signal-to-noise ratio of the photodetector and/or the angle-dependent properties of the photodetector.

As was the case in FIG. 2A, a beam of radiation 28 is used to illuminate an object 24. The object 24 may be a mark on a patterning device such as, for example, a pinhole in a reticle 26. An image of the object 24 is then projected through the layer of liquid 10 and onto a photodetector 12 using the projection system PS. As was the case in FIG. 2A, the photodetector 12 may be configured to detect the incident radiation 14 and output a signal indicative of the intensity of the radiation across a pupil plane of the projection system to a processor PR. The processor PR may be configured to store in memory a second set of measurements performed at the second liquid layer thickness d' shown in FIG. 2B. The processor PR may be further configured to determine a set of intensity differences from the first set of measurements and the second set of measurements. The determined set of intensity differences may then be compared to an expected set of intensity differences and the results of the comparison may be used to determine the photodetector contribution to apodization measurements performed by the photodetector 12.

The expected set of intensity differences may be calculated using knowledge of the absorption properties of the layer of liquid 10, the thicknesses d, d' of the layer of liquid 10 during the first set of measurements and the second set of measurements and the angles θ across which the cone of radiation 14 exits the projection system PS and is incident on the photodetector 12. The fraction of intensity of radiation 14 exiting the projection system PS that is absorbed by the layer of liquid 10 may be calculated via:

$$A = e^{-\frac{\alpha d}{\cos\theta}} \quad (1)$$

where α is the absorption coefficient of the layer of liquid, d is the thickness of the layer of liquid and θ is the angle at which radiation 14 exits the projection system PS relative to an optical axis 18 of the projection system PS. Equation (1) may be used to calculate an expected set of intensity differences caused solely by a change in the thickness of the layer of liquid 10 (i.e. not accounting for the photodetector contribution). The expected set of intensity differences may be represented mathematically as:

$$I_{ex} = I * A_2 - I * A_1 = \quad (2)$$
$$\left(I_{il}(\theta, \varphi) \cdot T_{ps}(\theta, \varphi) * e^{-\frac{\alpha d_2}{\cos\theta}}\right) - \left(I_{il}(\theta, \varphi) \cdot T_{ps}(\theta, \varphi) * e^{-\frac{\alpha d_1}{\cos\theta}}\right) =$$
$$I_{il}(\theta, \varphi) \cdot T_{ps}(\theta, \varphi) \left(e^{-\frac{\alpha d_2}{\cos\theta}} - e^{-\frac{\alpha d_1}{\cos\theta}}\right)$$

where $A_2$ is the fraction of radiation absorbed at a second liquid layer thickness, $A_1$ is the fraction of radiation absorbed at a first liquid layer thickness, I is the intensity of radiation exiting the projection system, $I_{il}(\theta,\varphi)$ is the intensity of radiation exiting the illumination system, $T_{ps}(\theta,\varphi)$ is the angle-dependent properties (i.e. apodization) of the projection system, $d_2$ is the second liquid layer thickness and $d_1$ is the first liquid layer thickness. The terms are represented above in spherical coordinates (i.e. an azimuthal component θ and/or an elevation component φ).

Figure 3:
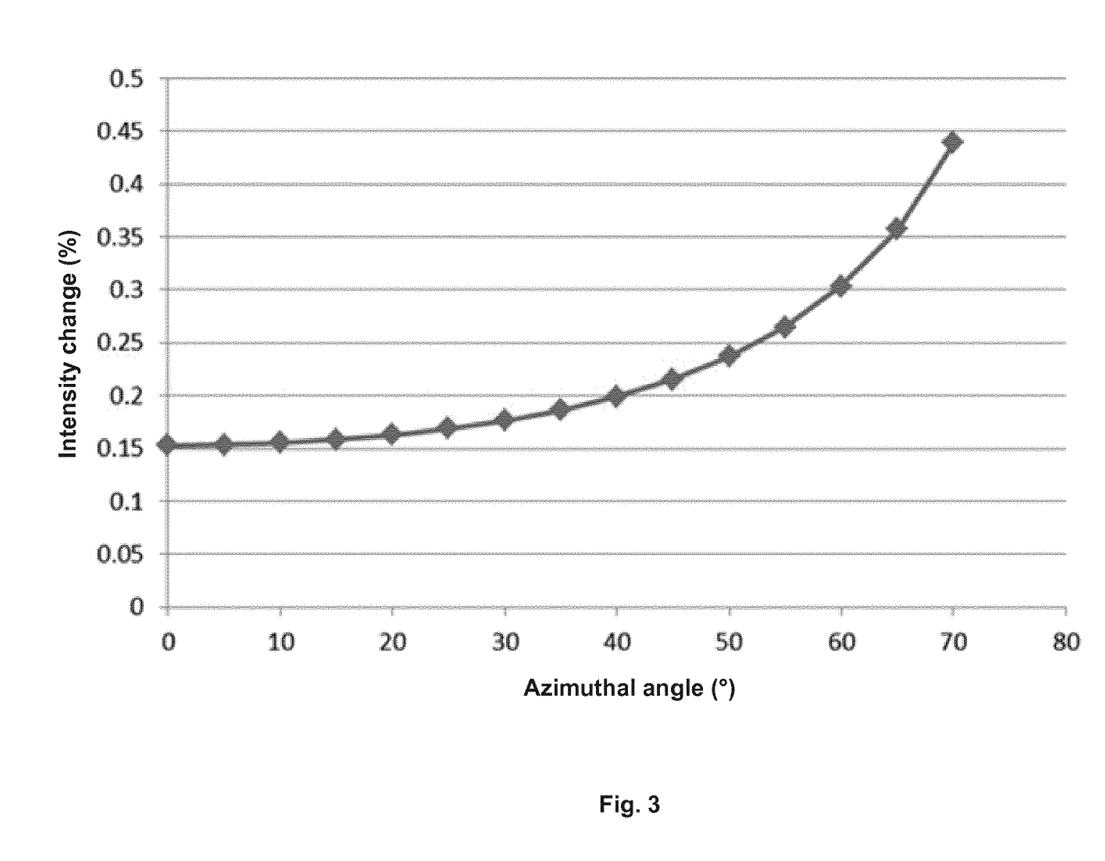
FIG. 3 shows a graph of a set of expected intensity differences caused solely by a change in the thickness of the layer of liquid.

FIG. 3 shows a graph of a set of expected intensity differences caused solely by a change in the thickness of the layer of liquid, determined using equations (1) and (2). In the example of FIG. 3, the angular extent of the cone of radiation exiting the projection system ranges from 0° to 70° about the optical axis of the projection system. The layer of liquid consists of water, and the thickness of the layer of liquid is decreased by 0.43 mm between a first set of intensity values and a second set of intensity values which together are used to generate the graph of FIG. 3.

As can be seen from FIG. 3, the change of intensity caused by the thickness change of the liquid layer is relatively low (i.e. from about 0.15% at low angles of incidence to about 0.45% at larger angles of incidence). FIG. 3 illustrates the exponential nature of the apodization introduced by changing the thickness of the layer of liquid. FIG. 3 shows a simulated change in apodization caused by changing the thickness of the layer of liquid without any changes in the illumination system contribution, the projection system contribution and the photodetector contribution. FIG. 3 was created under the assumption that the illumination system provides a perfectly circular beam of radiation having equally distributed intensity that is focused onto the layer of liquid. In practice the illumination system may provide different forms of radiation beam such as dipole or quadrupole illumination modes. The assumption was also made that the projection system will not apply any aberrations to the radiation beam, although in practice the projection system will apply aberrations to the radiation beam.

A graph of determined intensity differences may be plotted by performing a first set of measurements of intensity across the pupil plane (i.e. at different combinations of θ and φ that correspond with different pixels on the photodetector) at a first liquid layer thickness, performing a second set of measurements of intensity across the pupil plane at a different liquid layer thickness and determining a set of intensity differences between the first set of measurements and the second set of measurements. However, the determined set of intensity differences will differ from the expected set of intensity differences (e.g. the graph shown in FIG. 3) due to the presence of the illumination system contribution, the projection system contribution and the photodetector contribution. The determined set of intensity differences may be compared to the expected set of intensity differences and the results of the comparison may be used to determine the photodetector contribution.

The intensity of radiation across the pupil plane of the projection system that is measured by the photodetector may be represented mathematically by the following equation:

$$Imea(\theta,\varphi) = I_{il}(\theta,\varphi) \cdot T_{ps}(\theta,\varphi) \cdot e^{(-\alpha d/\cos(\theta))} C_{pd}(\theta,\varphi) \quad (3)$$

where $e^{(-\alpha d/\cos(\theta))}$ is the absorption of radiation by the layer of liquid and $C_{pd}(\theta,\varphi)$ is the photodetector contribution to the apodization measurement. Each term is represented in equation (3) using spherical coordinates (i.e. an azimuthal component $\theta$ and/or an elevation component $\varphi$). The determined set of intensity differences may be represented as:

$$Idet(\theta,\varphi) = (I_{il}(\theta,\varphi) \cdot T_{ps}(\theta,\varphi) \cdot e^{(-\alpha d_2/\cos(\theta))} + C_{pd1}(\theta,\varphi)) - (I_{il}(\theta,\varphi) \cdot T_{ps}(\theta,\varphi) \cdot e^{(-\alpha d_1/\cos(\theta))} + C_{pd2}(\theta,\varphi)) = I_{il}(\theta,\varphi) \cdot T_{ps}(\theta,\varphi)(e^{(-\alpha d_2/\cos(\theta))} - e^{(-\alpha d_1/\cos(\theta))}) + \Delta C_{pd} \quad (4)$$

where $C_{pd1}(\theta,\varphi)$ is the photodetector contribution to the first set of measurements, $C_{pd2}(\theta,\varphi)$ is the photodetector contribution to the second set of measurements and $\Delta C_{pd}$ is the difference between the photodetector contribution to the first set of measurements and the photodetector contribution to the second set of measurements. The exponential term $e^{(-\alpha d_2/\cos(\theta))} - e^{(-\alpha d_1/\cos(\theta))}$ corresponds with the expected set of intensity differences. Equation 4 assumes that the illuminator contribution and the projection system contribution remain constant between the two measurements. It may be assumed that the photodetector contribution remains constant between the two measurements. Under this assumption, equation 4 becomes:

$$Idet(\theta,\varphi) = I_{il}(\theta,\varphi) \cdot T_{ps}(\theta,\varphi)(e^{(-\alpha d_2/\cos(\theta))} - e^{(-\alpha d_1/\cos(\theta))}) \quad (5)$$

Thus, by performing a relative measurement the as yet unknown sensor contribution is removed from equation 4. Equation 5 may be re-arranged and solved to determine the term $I_{il}(\theta,\varphi) \cdot T_{ps}(\theta,\varphi)$.

For each pixel of the photodetector (i.e. for each combination of $\theta$ and $\varphi$) the determined intensity difference may be compared with the expected intensity difference. Curve fitting (i.e. statistical regression) may be used to compare the determined set of intensity differences to the expected set of intensity differences. That is, curve fitting (e.g. least squares fitting) may be used to determine a difference between the determined set of intensity differences and the expected set of intensity differences. The residual of the curve fitting is indicative of the photodetector contribution. That is, the results of the curve fitting procedure may be used to identify the part of the determined set of intensity differences that does not follow the exponential liquid layer thickness dependence. The part of the determined set of intensity differences that does not follow the exponential liquid layer thickness dependence is indicative of the photodetector contribution. The photodetector contribution may be different for different positions in the pupil plane.

The exponential term $$\left(\text{i.e. } e^{-\frac{\alpha d}{\cos\theta}}\right)$$

may have associated uncertainties. The absorption coefficient $\alpha$ of the layer of liquid may not have its expected value due to, for example, temperature variations of the layer of liquid and other properties of the liquid. The value of the thickness of the layer of liquid may be determined by, for example, sensors and actuators that position the substrate table. The sensors and actuators that position the substrate table may have associated errors. Therefore, the value of the thickness of the layer of liquid may also have an associated uncertainty. Although the value of the thickness of the layer of liquid may have an associated uncertainty, it is expected to be smaller than the uncertainty associated with the absorption coefficient of the layer of liquid because the sensors and actuators that control the position of the substrate table are typically highly accurate.

The uncertainty associated with the exponential term may negatively affect an accuracy of the determined photodetector contribution. When performing the curve fitting procedure the best fit that is achieved may provide a value of the absorption coefficient of the layer of liquid. Performing the apodization measurement at a greater number of thicknesses may improve the accuracy of the determined value of the absorption coefficient, thus improving an accuracy with which the photodetector contribution may be determined. In general, the greater the number of thicknesses at which the apodization measurement is performed, the more accurate the curve fitting procedure of the determined set of intensity differences to the expected set of intensity differences will be, and the more accurate the determined photodetector contribution will be.

The apodization measurement itself may suffer from noise. The presence of noise in the apodization measurement may negatively affect an accuracy with which the photodetector contribution may be determined. Performing the apodization measurement at more than two liquid layer thicknesses may reduce the negative effects associated with noise and improve an accuracy of the determined photodetector contribution.

Referring again to equation (3), the first term of equation (3) (i.e. the contribution from the illumination system, the projection system and the liquid layer $I_{il}(\theta,\varphi) \cdot T_{ps}(\theta,\varphi) \cdot e^{(-\alpha d/\cos(\theta))}$) includes an exponential cosine dependency in the azimuthal component $\theta$ whereas the second term of equation (3) (i.e. the photodetector contribution $C_{pd}(\theta,\varphi)$) does not include such a dependency in the azimuthal component $\theta$. The presence of the exponential cosine dependency in the first term and the absence of the exponential cosine dependency in the second term enables the first term and the second term to be discerned via comparing a measured set of intensity differences with an expected set of intensity differences (e.g. via a curve fitting procedure).

The photodetector contribution to apodization measurements may depend at least in part upon the illumination settings of the illumination system. The method of determining a photodetector contribution to apodization measurements described above may be repeated using different illumination settings of the illumination system to characterize the photodetector contribution to apodization measurements under different illumination settings. That is, a first set of measurements of radiation intensity may be performed at a first liquid layer thickness and a second set of measurements of radiation intensity may be performed at a different liquid layer thickness. A set of intensity differences may be determined from the first set of measurements and the second set of measurements. The known change in liquid layer thickness may be used to calculate an expected set of intensity differences. The determined set of intensity differences may be compared to the expected set of intensity differences. The results of the comparison may be used to determine the photodetector contribution under a first set of illumination settings. The illumination settings of the illumination system may be changed (e.g. a dipole illumination mode may be changed to a quadrupole illumination mode) and the first set of measurements and the second set of measurements may be repeated. A set of intensity differences may be determined from the first set of measurements and the second set of measurements. The known change in liquid layer thickness may be used to calculate an expected set of intensity differences. The determined set of intensity differences may be compared to the expected set of intensity differences. The results of the comparison may be used to characterize the photodetector contribution under the different illumination settings.

Referring again to FIG. 2, rays of radiation 14 exiting the projection system PS along the optical axis 18 of the projection system PS (i.e. θ=0) have a shorter optical path length through the layer of liquid 10 to the photodetector 12 than rays of radiation exiting the projection system PS at non-zero values of θ. The maximum half-angle θ of the cone of radiation 14 exiting the projection system PS is the same in FIG. 2A and FIG. 2B. However, the thickness d, d' of the layer of liquid 10 has been increased in FIG. 2B relative to FIG. 2A. When the thickness d, d' of the layer of liquid 10 is increased, the optical path length of rays of radiation 14 exiting the projection system PS at a larger angle θ increases by a greater amount than the optical path length of rays of radiation 14 exiting the projection system PS at a smaller angle θ. Thus, the fraction of radiation 14 that is absorbed by the layer of liquid 10 increases by a greater amount for rays of radiation travelling along an edge 16 of the cone of radiation 14 compared with rays of radiation travelling along the optical axis 18 of the projection system PS. This may be seen, for example, in FIG. 3 which shows an intensity change of about 0.45% at an edge of the cone of radiation compared to an intensity change of about 0.15% at a centre of the cone of radiation. Changing the thickness of the layer of liquid therefore applies a change to the transmission of radiation passing through the layer of liquid, the change being dependent on the angle of incidence of the radiation (i.e. a known change in apodization properties of the projection system is applied to the projection system by changing the thickness of the layer of liquid).

The absorption coefficient of the layer of liquid 10 depends on the liquid used as the layer of liquid and the wavelength of radiation that passes through the layer of liquid. For example, the absorption coefficient of water is about 0.036 cm$^{-1}$ when radiation having a wavelength of 193 nm passes through the water. When using water as the layer of liquid (or other liquids having a similarly low absorption coefficient) the thickness d of the layer of liquid 10 may have to be changed by a relatively large amount (e.g. about 100 μm) in order to induce a detectable change in the transmission of radiation through the layer of liquid.

Changing the thickness of the layer of liquid by a relatively large amount may cause the image of the object to no longer be in focus at the photodetector. If the image is out of focus then radiation from some angles of incidence may be lost because the radiation is no longer incident on a photosensitive area of the photodetector. If nothing is done to keep the image of the object in focus at the photodetector when the thickness of the layer of liquid is changed then the extent to which the thickness of the layer of liquid may be changed may depend at least in part upon the size of the photosensitive area of the photodetector. In order to accurately characterize the apodization properties of the projection system preferably the entire pupil plane (i.e. radiation across all angles of incidence) is detected by the photodetector. One method of keeping the image in focus after changing the thickness of the layer of liquid involves moving the object.

Figure 4:
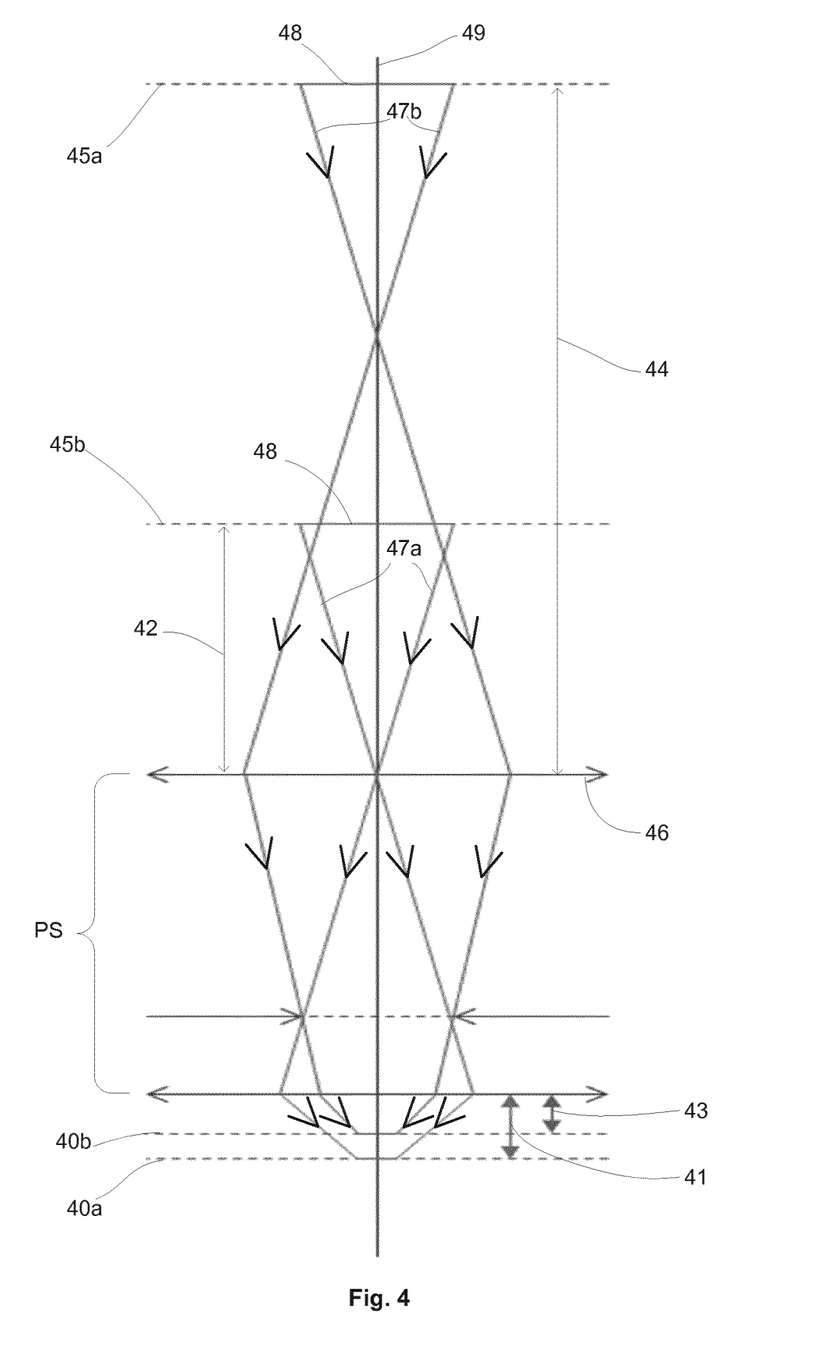
FIG. 4 schematically depicts part of an immersion lithography apparatus according to an embodiment of the invention.

FIG. 4 schematically depicts part of an immersion lithography apparatus according to an embodiment of the invention. Two configurations of the immersion lithography apparatus are shown in FIG. 4. In a first configuration, a first image plane 40a is at a first distance 41 from the projection system PS and the object 48 (e.g. a reticle comprising a mark) is at a second distance 42 from the projection system PS. The photodetector (not shown) may be located at the first image plane 40a. A liquid layer (not shown) extends between the projection system PS and the first image plane 40a. The thickness of the layer of liquid in the first configuration is equal to the first distance 41. Radiation 47a which has illuminated the object 48 travels from the object 48 to an entrance 46 of the projection system PS along an optical axis 49 of the projection system PS. The projection system PS is then used to project an image of the object 48 through the layer of liquid and onto the photodetector at the first image plane 40a. The photodetector may be used to perform a first set of measurements of radiation intensity across a pupil plane of the projection system PS at the first liquid layer thickness 41.

In a second configuration the thickness of the layer of liquid has been decreased relative to the first configuration. In the second configuration a second image plane 40b is at a third distance 43 from the projection system PS and the object 48 is at a fourth distance 44 from the projection system PS. The thickness of the layer of liquid in the second configuration is equal to the third distance 43. Radiation 47b which has illuminated the object 48 travels from the object 48 to the entrance 46 of the projection system PS. The projection system PS is then used to project an image of the object 48 through the layer of liquid and onto the photodetector (not shown) at the second image plane 40b. The photodetector may be used to perform a second set of measurements of radiation intensity across a pupil plane of the projection system PS at the second liquid layer thickness 43.

If the distance between the object 48 and the projection system PS was not changed when moving from the first configuration to the second configuration (i.e. when decreasing the thickness of the layer of liquid) then the image of the object would no longer be in focus at the first image plane 40a. If the image of the object is not in focus then some of the cone of radiation exiting the projection system PS may not reach the photodetector, and some information relevant to the apodization of the projection system PS may be lost (i.e. some of the pupil plane of the projection system PS may not reach the photodetector and therefore will not be included in the apodization measurement). The distance 42 between the object 48 and the projection system PS may therefore be changed when changing from the first configuration to the second configuration to keep the image of the object in focus at the second image plane 40b. If the distance between the object 48 and the projection system PS is changed then the extent to which the thickness of the layer of liquid may be changed may depend at least in part upon aberrations of the projection system PS affecting the image of the object because the object will no longer be in the perfect focus with respect to the projection system PS. In the example of FIG. 4, the projection system PS is a double telecentric optical system that is configured to de-magnify the object 48 in the object plane 45a, 45b by four times at the image plane 40a, 40b. In the example of FIG. 4, when the distance between the photodetector and the projection system PS is decreased by an amount, the distance between the object 48 and the projection system PS is increased by sixteen times (i.e. the demagnification squared, $4^2$) that amount to keep the image of the object 48 in focus. When the distance between the photodetector and the projection system PS is increased by an amount, the distance between the object 48 and the projection system PS is decreased by sixteen times that amount to keep the image of the object in focus. Other optical systems having different optical arrangements and/or optical properties may require different adjustments to keep the image of the object in focus when changing a thickness of the layer of liquid.

In an alternative approach, the photodetector may be designed to reduce the amount of radiation that does not reach the photodetector when the thickness of the layer of liquid is changed. For example, the photosensitive area of the photodetector may be increased to avoid or reduce any loss of radiation when the thickness of the layer of liquid is changed and the position at which the image of the object is in focus is changed. The photodetector may be calibrated so as to perform out of focus apodization measurements.

Some lithographic apparatus may not have enough available space to move the object by the required amount to keep the image of the object in focus at the photodetector when the thickness of the layer of liquid is changed. The extent to which positioning devices may move stages (e.g. the reticle stage) in an immersion lithographic apparatus may be limited. One method of reducing the distance by which the object needs to be moved to keep the image of the object in focus includes applying a first mark (i.e. a first object) to a first side of a reticle for use in the first set of measurements (i.e. at a first liquid layer thickness) and applying a second mark (i.e. a second object) to an opposing side of the reticle for use in the second set of measurements (i.e. at a second liquid layer thickness). That is, the thickness of the reticle may be utilised to effectively move the object between the first set of measurements and the second set of measurements to keep the image of the object in focus at the photodetector.

Figure 5A:
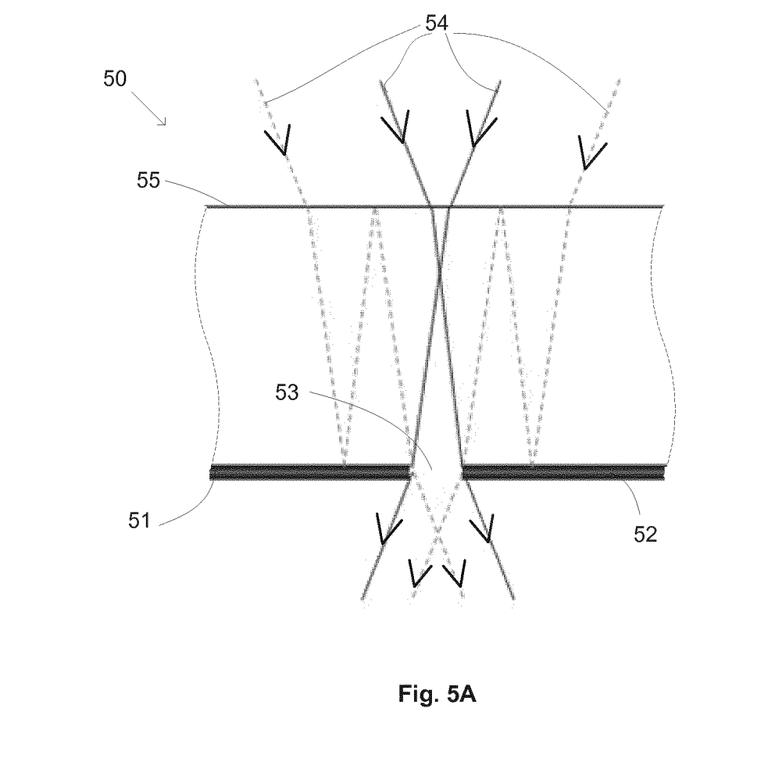
FIGS. 5A-5B schematically depict an object on a reticle which may be used in an embodiment of the invention; and, FIGS. 6A-6B schematically depict an object on a reticle comprising an aperture which may be used in an embodiment of the invention.
Figure 5B:
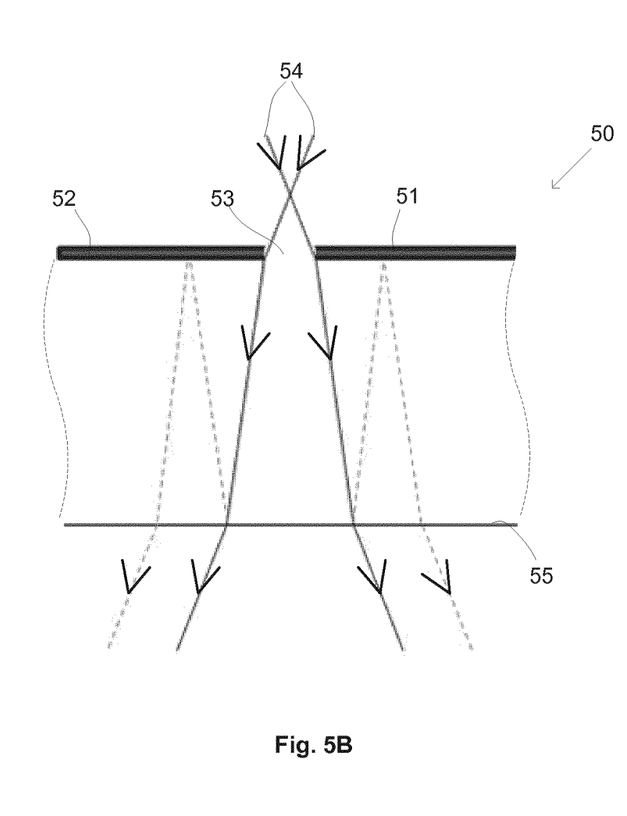

FIG. 5, consisting of FIG. 5A and FIG. 5B schematically depicts an object 53 on a reticle 50 which may be used in an embodiment of the invention. The reticle 50 is a transmissive reticle which may, for example, comprise quartz. A first surface 51 of the reticle 50 comprises an absorbing layer 52. The absorbing layer 52 may, for example, comprise chrome. The reticle comprises an object 53 which may be illuminated with radiation 54 so as to form an image of the object which may be projected onto a photodetector (not shown) using a projection system (not shown). In the example of FIG. 5, the object is a pinhole 53 in the absorbing layer 52 of the reticle 50. FIG. 5A shows the reticle 50 orientated such that incident radiation 54 enters the reticle 50 via a boundary 55 between the reticle 50 and the surrounding environment. The surrounding environment may, for example, comprise air. The direction of propagation of the radiation 54 is represented by arrow heads in FIG. 5. Incident radiation 54 may enter the reticle and exit the pinhole 53 without undergoing reflection. Non-reflected radiation is represented using a continuous line in FIG. 5. Some of the incident radiation 54 may enter the reticle 50 and reflect from the absorbing layer 52 of the reticle 50. Radiation 54 that enters the reticle 50 and is reflected by the absorbing layer 52 is represented using a dashed line in FIG. 5. Some of the radiation that reflects from the absorbing layer 52 of the reticle 50 may reflect at the boundary 55 between the reticle 50 and the surroundings. Some of the radiation 54 that reflects from the boundary 55 may exit the reticle 50 via the pinhole 53.

The reticle 50 may be inverted after the first set of measurements has taken place such that a distance between the object 53 and the projection system is changed before the second set of measurements take place. Alternatively, a second object may be formed on an opposing side of the reticle such that the second object does not align with the first object and the reticle may be moved after the first set of measurements such that the second object is illuminated during the second set of measurements. Either of these alternatives may advantageously keep the image of the object in focus at the photodetector after changing the thickness of the layer of liquid. Providing a second object on an opposing side of the reticle advantageously avoids the need to invert the reticle between the first set of measurements and the second set of measurements. The distance by which the image of the object is effectively moved by inverting the reticle (or by moving the reticle such that a second object on the opposing side of the reticle is illuminated) may be calculated via the following equation:

$$\Delta d = \frac{n_{ret}}{n_{ll}} \times \frac{d_{ret}}{M^2} \quad (6)$$

where $n_{ret}$ is the refractive index of the reticle, $n_{ll}$ is the refractive index of the layer of liquid, $d_{ret}$ is the thickness of the reticle and M is the factor by which the projection system reduces the size of an image of an object. For example, for a quartz ($n_{ret}$=1.56) reticle having a thickness of 6.35 mm and a liquid layer consisting of water ($n_{ll}$=1.44) both used in the optical system depicted in FIG. 4 (M=16), the distance by which the image of the object is effectively moved by inverting the reticle is:

$$\Delta d = \frac{1.56}{1.44} \times \frac{6.35}{16} \approx 430 \text{ μm}$$

FIG. 5B shows the reticle 50 orientated such that incident radiation 54 enters the reticle 50 via the pinhole 53. That is, FIG. 5B shows the reticle 50 of FIG. 5A after the reticle 50 has been inverted. Some of the incident radiation 54 may enter the reticle 50 via the pinhole 53 and exit the reticle 50 via the boundary 55 without undergoing reflection. Some of the incident radiation 54 may enter the reticle 50 via the pinhole 53 and reflect from the boundary 55 between the reticle 50 and the surrounding environment. The surrounding environment may, for example, comprise air. Some of the radiation 54 that reflects from the boundary 55 may undergo further reflection at the absorbing layer 52 of the reticle 50. Some of the radiation 54 that reflects from the absorbing layer 52 may exit the reticle 50 via the boundary 55. In the case of FIG. 5B, radiation 54 that has undergone internal reflections within the reticle 50 before exiting the pinhole 53 may contribute to a halo effect around the image of the object. The presence of a halo effect around the image of the object may negatively affect the accuracy of measurements of radiation intensity across a pupil plane of the projection system performed using the photodetector. One method of reducing internal reflections within the reticle 50 includes providing the reticle with an anti-reflective coating opposite the absorbing layer 52. However, the anti-reflective coating may not reduce reflections equally across all angles of incidence. Another method of reducing internal reflections within the reticle 50 includes providing a reticle having two opposing absorbing layers, with one of the absorbing layers comprising the pinhole and the other absorbing layer comprising an aperture directly opposite the pinhole.

Figure 6A:
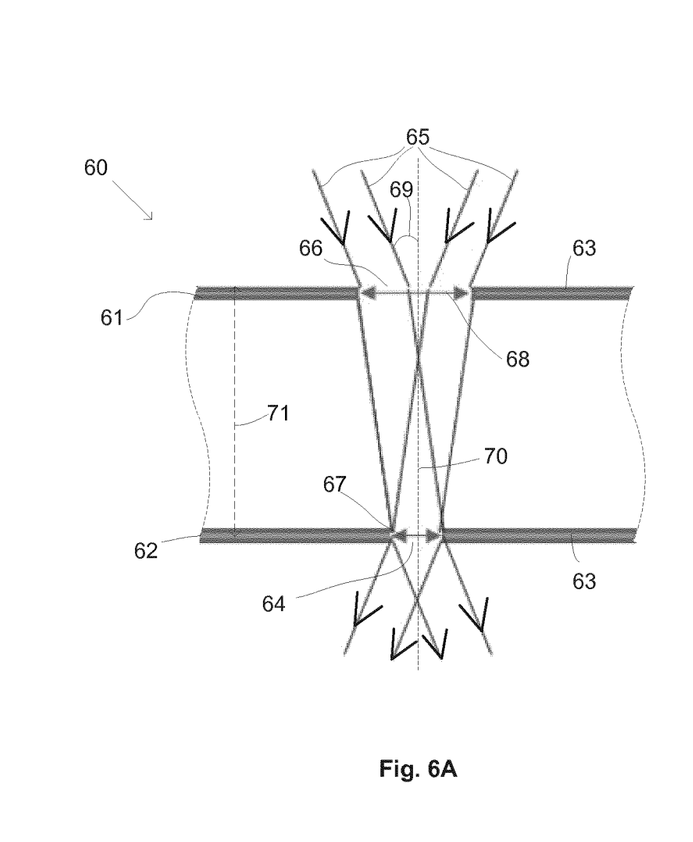
Figure 6B:
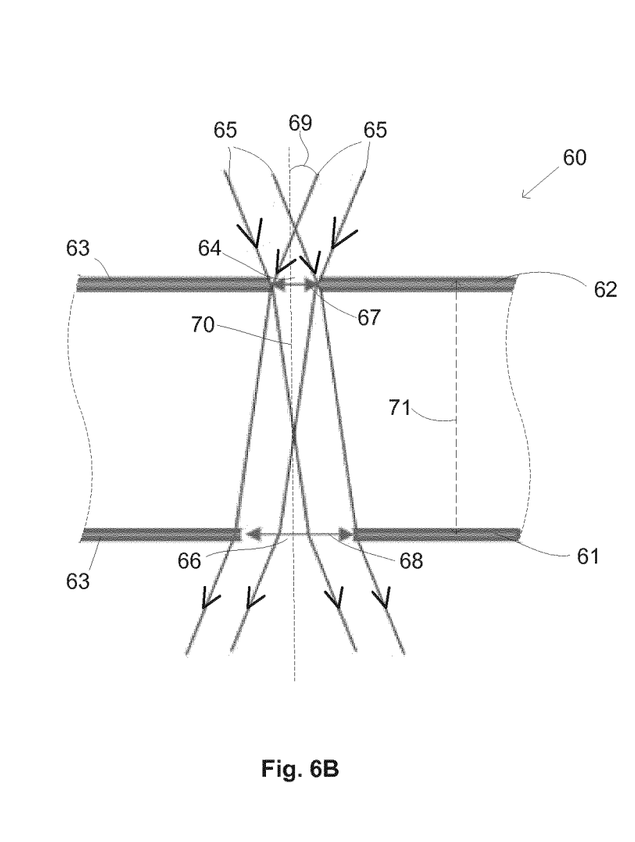

FIG. 6, consisting of FIG. 6A and FIG. 6B, schematically depicts an object 64 on a reticle 60 that may be used in an embodiment of the invention. The reticle 60 is a transmissive reticle which may, for example, comprise quartz. A first surface 61 of the reticle 60 comprises a absorbing layer 63. A second surface 62 of the reticle 60 comprises a absorbing layer 63. The second surface 62 opposes the first surface 61. The absorbing layer 63 may, for example, comprise chrome. The reticle 60 comprises an object 64 which may be illuminated with radiation 65 so as to form an image of the object which may be projected onto a photodetector (not shown) using a projection system (not shown). The direction of propagation of the radiation 65 is represented by arrow heads in FIG. 6. In the example of FIG. 6, the object is a pinhole 64 in a absorbing layer 63 of the reticle 60. FIG. 6A shows the reticle 60 orientated such that incident radiation 65 enters the reticle 60 via an aperture 66 in the absorbing layer 63 on the first surface 61 of the reticle 60 and exits the reticle 60 via the pinhole 64 in the absorbing layer 63 on the second surface 62 of the reticle 60. The aperture 66 may be larger than the pinhole 64 and may be provided in the absorbing layer 63 directly opposite the pinhole 64.

The arrangement of the opposing absorbing layers 63, the pinhole 64 and the aperture 66 is configured to reduce the halo effect caused by internally reflected radiation exiting the reticle 60 and reaching the photodetector. The diameter 67 of the pinhole 64 and the diameter 68 of the aperture 66 may be selected such that substantially all of the radiation 65 that enters the reticle 60 does not undergo internal reflection within the reticle 60. This selection may depend at least in part upon the following three parameters: a maximum angle 69 of incident radiation 65 relative to an optical axis 70 of the lithographic apparatus; a thickness 71 of the reticle 60; and, a refractive index of the reticle 60. These three parameters describe how transmitted radiation will travel through the reticle 60. For example, a diameter 68 of the aperture 66 may be selected and used in combination with the three parameters discussed above to calculate an exit diameter across which the radiation 65 will exit the reticle 60. The diameter 67 of the pinhole 64 may then be selected to be greater than or equal to the calculated exit diameter, thereby ensuring that substantially all of the radiation 65 that enters the reticle 60 via the aperture 66 exits the reticle via the pinhole 64 rather than undergoing internal reflections within the reticle 60. The maximum angle 69 of incident radiation 65 may be selected by controlling the illumination system of the lithographic apparatus.

FIG. 6B schematically depicts the reticle 60 shown in FIG. 6A orientated such that incident radiation 65 enters the reticle 60 via the pinhole 64 in the absorbing layer 63 on the second surface 62 of the reticle 60 and exits the reticle 60 via the aperture 66 in the absorbing layer 63 on the first surface 61 of the reticle 60. As was the case in FIG. 6A, the arrangement of the opposing absorbing layers 63, the pinhole 64 and the aperture 66 is configured to reduce the halo effect caused by internally reflected radiation exiting the reticle 60 and reaching the photodetector. The diameter 67 of the pinhole 64 and the diameter 68 of the aperture 66 may be selected such that substantially all of the radiation 65 that enters the reticle 60 does not undergo internal reflection within the reticle 60. This selection may depend at least in part upon the three parameters discussed above, namely: the maximum angle 69 of incident radiation 65 relative to an optical axis 70 of the lithographic apparatus; the thickness 71 of the reticle 60; and, the refractive index of the reticle 60. For example, a diameter 67 of the pinhole 64 may be selected and used in combination with the three parameters discussed above to calculate an exit diameter across which the radiation 65 will exit the reticle 60. The diameter 68 of the aperture 66 may then be selected to be greater than or equal to the calculated exit diameter, thereby ensuring that substantially all of the radiation 65 that enters the reticle 60 via the pinhole 64 exits the reticle 60 via the aperture 66 rather than undergoing internal reflections within the reticle 60. For example, for radiation 65 having a maximum angle 69 of about 20° entering a reticle 60 having a thickness 71 of about 6.35 mm and a refractive index of about 1.56, the diameter 67 of the pinhole 64 may be selected as about 0.10 mm and the diameter of the aperture may be selected as about 2.9 mm.

The object may have any desired form. For example, the object may be a grating pattern in an absorbing layer of a reticle.

The layer of liquid may comprise a fluid or fluids other than water.

The absorbing layer may comprise an absorbing material other than chrome. The transmissive reticle may comprise a material other than quartz. The reticle may have a thickness other than 6.35 mm.

The photodetector may comprise a sensor other than an ILIAS sensor.

In an alternative embodiment of the invention, the thickness of the layer of liquid is not changed. Instead, the first set of measurements of radiation intensity across a pupil plane of the projection system is performed using a first liquid then the first liquid is replaced with a second liquid having a different absorption coefficient. The second set of measurements of the radiation intensity across the pupil plane of the projection system is performed using the second liquid. A set of intensity differences may be determined from the first set of measurements and the second set of measurements. Knowledge of the absorption coefficient of the first liquid, the absorption coefficient of the second liquid and the thickness of the layer of liquid may be used to calculate an expected set of intensity differences. The determined set of intensity differences may be compared to the expected set of intensity differences. The results of the comparison may be used to determine the photodetector contribution to a measurement of apodization. The first liquid may be replaced with the second liquid using, for example, a pumping system. Replacing the first liquid with a second liquid having a different absorption coefficient advantageously avoids the need to move the photodetector thereby reducing or avoiding focusing errors (e.g. parts of the cone of radiation not reaching the photodetector) associated with movement of the photodetector. The first liquid and the second liquid may have substantially the same refractive index.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

While specific embodiments of the invention have been described above, it will be appreciated that the invention may be practiced otherwise than as described. The description is not intended to limit the invention.

The invention claimed is:

1. A method of determining a photodetector contribution to a measurement of apodization of a projection system of an immersion lithography apparatus, the method comprising:
   providing a beam of radiation;
   illuminating an object with the beam of radiation;
   using the projection system to project an image of the object through a liquid layer and onto a photodetector;
   performing a first set of measurements of radiation intensity across a pupil plane of the projection system at a first liquid layer thickness;
   performing a second set of measurements of radiation intensity across the pupil plane of the projection system at a different liquid layer thickness;
   determining a set of intensity differences from the first set of measurements and the second set of measurements;
   comparing the determined set of intensity differences to an expected set of intensity differences; and
   using results of the comparison to determine the photodetector contribution to the measurement of apodization.

2. The method of claim 1, wherein the comparison comprises determining a difference between the determined set of intensity differences and a mathematical function that is used to calculate the expected set of intensity differences.

3. The method of claim 2, wherein:
   the determining the difference between the determined set of intensity differences and the mathematical function comprises using curve fitting; and
   the mathematical function comprises an exponential term.

4. The method of claim 1, wherein the method further comprises:
   changing an illumination setting of the lithographic apparatus; and
   repeating the first set of measurements and the second set of measurements.

5. The method of claim 1, wherein:
   a substrate table comprises the photodetector; and
   the difference in liquid layer thickness between the first set of measurements and the second set of measurements is achieved by movement of the substrate table.

6. The method of claim 1, further comprising:
   providing the object at a first distance from the projection system during the first set of measurements; and
   providing the object at a different distance from the projection system during the second set of measurements.

7. The method of claim 1, further comprising:
   providing the object on a surface of a reticle; and
   inverting the reticle after the first set of measurements, such that a distance between the object and the projection system is changed before the second set of measurements.

8. The method of claim 7, further comprising providing opposing surfaces of the reticle with absorbing layers.

9. The method of claim 8, wherein the object is a mark provided in one of the absorbing layers.

10. The method of claim 9, further comprising providing an aperture that is larger than the mark in the absorbing layer directly opposite the mark.

11. The method of claim 9, wherein:
    a second substantially identical mark is formed in the other absorbing layer, such that the second mark does not align with the first mark;
    the first mark is illuminated during the first set of measurements; and
    the reticle is moved after the first set of measurements, such that the second mark is illuminated during the second set of measurements.

12. The method of claim 1, wherein the sets of measurements of radiation intensity across the pupil plane of the projection system are performed at more than two liquid layer thicknesses.

13. The method of claim 2, wherein the results of the measurements are used to improve an accuracy of the mathematical function that is used to calculate the expected set of intensity differences.

14. A method of determining a photodetector contribution to a measurement of apodization of a projection system of an immersion lithography apparatus, the method comprising:
    providing a beam of radiation;
    illuminating an object with the beam of radiation;
    using the projection system to project an image of the object through a liquid layer and onto a photodetector;
    performing a first set of measurements of radiation intensity across a pupil plane of the projection system using a first liquid;
    replacing the first liquid with a second liquid having a different absorption coefficient;
    performing a second set of measurements of radiation intensity across the pupil plane of the projection system using the second liquid;
    determining a set of intensity differences from the first set of measurements and the second set of measurements;
    comparing the determined set of intensity differences to an expected set of intensity differences; and
    using results of the comparison to determine the photodetector contribution to a measurement of apodization.

15. The method of claim 14, wherein the first liquid and the second liquid have substantially a same refractive index.

16. An immersion lithography apparatus comprising:
    an illumination system configured to provide a beam of radiation;
    a support structure configured to support a reticle comprising an object;
    a substrate table configured to hold a substrate, the substrate table comprising a photodetector;
    a projection system configured to project the radiation beam onto the photodetector;
    an immersion hood configured to provide a liquid layer between the projection system and the photodetector;
    a positioning device configured to move the substrate table so as to enable adjustment of a thickness of the liquid layer; and
    a processor configured to receive a first set of measurements from the photodetector at a first liquid layer thickness, receive a second set of measurements from the photodetector at a different liquid layer thickness, determine a set of intensity differences from the first set of measurements and the second set of measurements, compare the determined set of intensity differences to an expected set of intensity differences and use the results of the comparison to determine a photodetector contribution to the measurements.

17. A non-transitory computer program comprising computer readable instructions configured to cause a computer to carry out a method of determining a photodetector contribution to a measurement of apodization of a projection system of an immersion lithography apparatus, the method comprising:

receiving, from a photodetector, a first set of measurements of radiation intensity across a pupil plane of the projection system at a first liquid layer thickness, wherein an image of an object is projected by the projection system through a liquid layer and onto the photodetector;

receiving, from the photodetector, a second set of measurements of radiation intensity across the pupil plane of the projection system at a different liquid layer thickness;

determining a set of intensity differences from the first set of measurements and the second set of measurements;

comparing the determined set of intensity differences to an expected set of intensity differences; and using results of the comparison to determine the photodetector contribution to a measurement of apodization.

18. A computer readable medium carrying a non-transitory computer program of claim 17.

19. An apparatus for determining a photodetector contribution to a measurement of apodization of a projection system of an immersion lithography apparatus, the apparatus comprising:

a memory storing processor readable instructions; and a processor arranged to read and execute instructions stored in the memory, wherein the processor readable instructions comprise instructions arranged to control the processor to carry out a method of determining a photodetector contribution to a measurement of apodization of a projection system of an immersion lithography apparatus, the method comprising:

receiving, from a photodetector, a first set of measurements of radiation intensity across a pupil plane of the projection system at a first liquid layer thickness wherein an image of an object is projected by the projection system through a liquid layer and onto the photodetector;

receiving, from the photodetector, a second set of measurements of radiation intensity across the pupil plane of the projection system at a different liquid layer thickness;

determining a set of intensity differences from the first set of measurements and the second set of measurements;

comparing the determined set of intensity differences to an expected set of intensity differences; and using results of the comparison to determine the photodetector contribution to a measurement of apodization.

* * * * *